US009793735B2

(12) United States Patent
Choi (10) Patent No.: US 9,793,735 B2
(45) Date of Patent: Oct. 17, 2017

(54) CHARGER HAVING BATTERY DIAGNOSTIC FUNCTION AND CONTROL METHOD THEROF

(71) Applicant: Foundation of Soongsil University—Industry Cooperation, Seoul (KR)

(72) Inventor: Woojin Choi, Seoul (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 295 days.

(21) Appl. No.: 14/436,323

(22) PCT Filed: Oct. 24, 2013

(86) PCT No.: PCT/KR2013/009497
§ 371 (c)(1),
(2) Date: Apr. 16, 2015

(87) PCT Pub. No.: WO2015/030295
PCT Pub. Date: Mar. 5, 2015

(65) Prior Publication Data
US 2015/0288197 A1    Oct. 8, 2015

(30) Foreign Application Priority Data

Aug. 30, 2013    (KR) .................. 10-2013-0104127

(51) Int. Cl.
*G01N 27/416*    (2006.01)
*H02J 7/00*    (2006.01)
(Continued)

(52) U.S. Cl.
CPC .......... *H02J 7/007* (2013.01); *G01R 31/3679* (2013.01); *H02J 7/0021* (2013.01);
(Continued)

(58) Field of Classification Search
USPC ....................................................... 324/430
See application file for complete search history.

(56) References Cited

U.S. PATENT DOCUMENTS

| 2006/0170397 A1* | 8/2006 | Srinivasan | G01R 31/3624 |
| | | | 320/132 |
| 2013/0141109 A1* | 6/2013 | Love | G01R 31/3606 |
| | | | 324/430 |

FOREIGN PATENT DOCUMENTS

| EP | 1243934 B1 | 5/2008 |
| JP | 2004-264076 A | 9/2004 |

(Continued)

OTHER PUBLICATIONS

Thanh-Tuan Nguyen et al. "Development of the Intelligent Charger with Embedded Battery Diagnosis Function Using Online Impedance Spectroscopy" Korea Institute of Power Electronics Journal, vol. 2013 No. 7, pp. 329-330 (Jul. 4, 2013).

(Continued)

*Primary Examiner* — Robert Grant
(74) *Attorney, Agent, or Firm* — Novick, Kim, & Lee, PLLC; Sang Ho Lee (57) ABSTRACT

The present invention relates to a charger capable of diagnosing a lifespan of a battery when the battery is being charged, and a control method thereof. The charger includes a converter applying one of a perturbation voltage and a perturbation current to a battery, and a digital signal processor transmitting a perturbation signal in which an AC signal is added to a DC signal via the converter, measuring an output response of the battery, calculating an impedance spectrum according to the output response of the battery, calculating an impedance parameter by selecting an equivalent circuit according to the impedance spectrum, and estimating a lifespan of the battery by comparing the calculated (Continued)

impedance parameter of the battery with a predetermined impedance parameter of a reference battery.

12 Claims, 6 Drawing Sheets

(51) Int. Cl.
    *H02J 7/02*     (2016.01)
    *G01R 31/36*     (2006.01)

(52) U.S. Cl.
    CPC .............. *H02J 7/022* (2013.01); *H02J 7/025* (2013.01); *G01R 31/3662* (2013.01)

(56) References Cited

FOREIGN PATENT DOCUMENTS

| | | |
|---|---|---|
| JP | 2010-281588 A | 12/2010 |
| JP | 2012-122817 A | 6/2012 |
| KR | 10-2011-0124204 A | 11/2011 |
| KR | 10-2012-0071600 A | 7/2012 |

OTHER PUBLICATIONS

Joo Hyung Lee. "Development of Electrochemical Impedance Spectroscopy System based on LabVIEW" C & I, pp. 99-102. Mar. 2010.

\* cited by examiner

CHARGER HAVING BATTERY DIAGNOSTIC FUNCTION AND CONTROL METHOD THEROF

TECHNICAL FIELD

The present invention relates to a charger capable of diagnosing a lifetime and an abnormal state of a battery, and a control method thereof.

BACKGROUND ART

Generally, batteries may be subjected to cycles of discharging by which chemical energy is changed into electrical energy, and charging by which electrical energy is changed into chemical energy. Most common batteries may be a lead-acid batteries, an application of galvanic cells. A lead-acid battery may consist of a Pb electrode and a $PbO_2$ electrode in a concentrated sulfuric acid solution, and a lifetime of the lead-acid battery may be reduced due to various forms of aging processes including a change in an internal active material after the cycles of charging and discharging for a long time and a self-discharging phenomenon.

Meanwhile, the above-described battery may be periodically charged through a charger. Normally, such the charger may serve to charge a battery, but may not serve to diagnose a status of battery. Accordingly, since users do not know a lifetime of a battery while using the battery, the users may not recognize an inoperative state or failure sign of a system, caused by a sudden ending of a battery lifetime, in advance. Accordingly, a reliability of a system using the battery may be lowered.

DISCLOSURE

Technical Problem

Accordingly, the present invention is directed to a charger capable of diagnosing a lifetime of a battery to notify a user while charging the battery, and a control method thereof.

Technical Solution

According to an aspect of the present invention, there is provided a charger includes a converter applying a perturbation voltage or a perturbation current to a battery, and a digital signal processor transmitting a perturbation signal in which an alternating current (AC) signal is added to a direct current (DC) signal to the converter, measuring an output response of the battery, calculating an impedance spectrum according to the output response of the battery, calculating an impedance parameter by selecting an equivalent circuit according to the impedance spectrum, and estimating a lifetime of the battery by comparing the calculated impedance parameter of the battery to a predetermined impedance parameter of a reference battery.

The digital signal processor may include a reference DC generator outputting the DC signal and an AC signal generator outputting the AC signal, and the reference DC generator may be one of a reference voltage generator or a reference current generator.

When charging of the battery is completed, the converter may apply the perturbation voltage to the battery and induce the digital signal processor to measure the output response.

The converter may charge the battery in a constant current/constant voltage mode, and apply the perturbation current to the battery at a time at which the constant voltage mode is switched to the constant current mode.

The digital signal processor may include a digital lock-in amplifier, which extracts the impedance spectrum from the output response of the battery.

The digital signal processor may include a parameter extractor, which selects an equivalent circuit model of the battery according to the impedance spectrum extracted by the digital lock-in amplifier and extracts the impedance parameter in such a method of extracting a parameter of the equivalent circuit model.

The digital signal processor may include a parameter analyzer, which compares the impedance parameter extracted from the battery with a predetermined reference parameter and analyzes them.

The digital signal processor may further include a lifetime estimator, which determines the lifetime of the battery as being short in proportion to a size difference between the impedance parameter and the reference parameter.

The charger may further include an alarm outputting a warning signal according to the lifetime of the battery, and the alarm may output the warning signal when the lifetime of the battery is a predetermined reference value or less.

According to an aspect of the present invention, there is provided a method of controlling a charger includes applying a perturbation voltage or a perturbation current to a battery, calculating an impedance spectrum by measuring a response output from the battery, extracting an impedance parameter by selecting an equivalent circuit according to the impedance spectrum, and estimating a lifetime of the battery by comparing the impedance parameter to a pre-stored impedance parameter of a reference battery.

The applying of the perturbation voltage or the perturbation current to the battery may include applying the perturbation voltage after charging of the battery is completed, or applying the perturbation current at a boundary time at which a charging mode of the battery is switched from a constant current mode to a constant voltage mode.

The lifetime of the battery may be estimated as being short in proportion to a difference between the impedance parameter of the battery and the pre-stored impedance parameter of the reference battery.

The method may further include outputting a warning signal when the lifetime of the battery is a predetermined reference lifetime or less.

Advantageous Effects

According to the embodiment of the present invention, a sudden failure may be pre-detected by diagnosing the lifetime of the battery, and costs for post-processing due to the failure of the battery and management cost may be reduced.

MODES FOR CARRYING OUT THE INVENTION

Hereinafter, various embodiments will now be described more fully with reference to the accompanying drawings in which some embodiments are shown. However, since the invention is not limited to the embodiments disclosed hereinafter, the embodiments of the invention should be implemented in various forms. The same reference numbers will be used throughout this specification to refer to the same or like components.

Figure 1A:
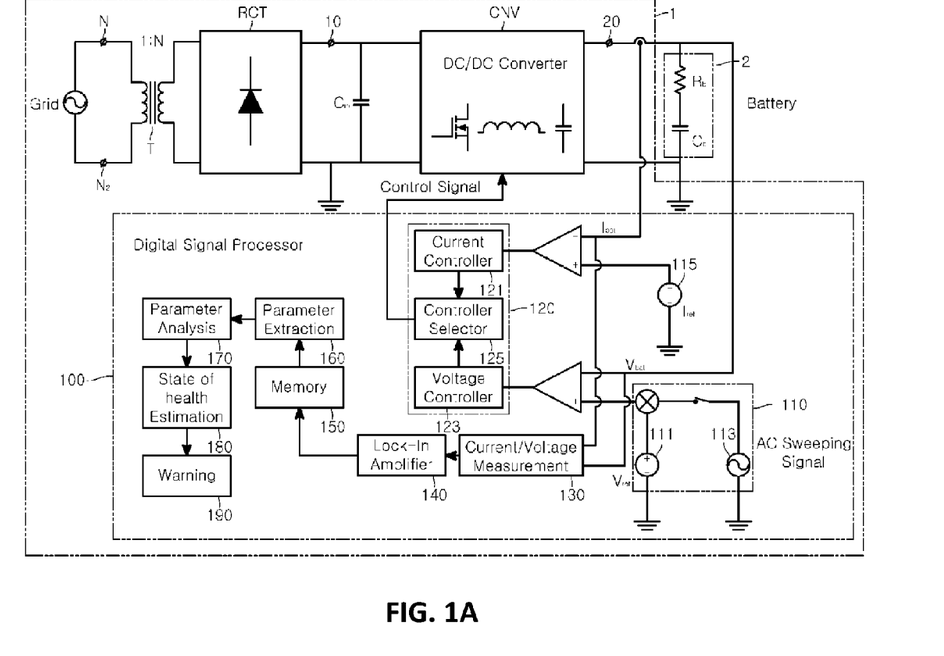
FIG. 1A is a schematic control block diagram of a charger according to an embodiment of the present invention.
Figure 1B:
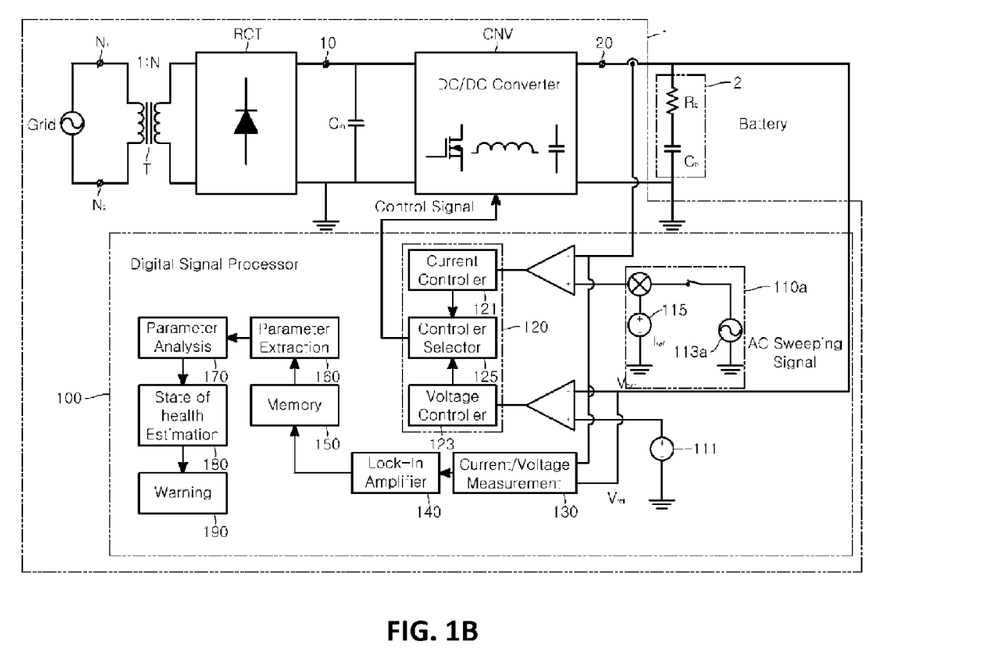
FIG. 1B is a schematic control block diagram of a charger according to another embodiment of the present invention.
Figure 2A:
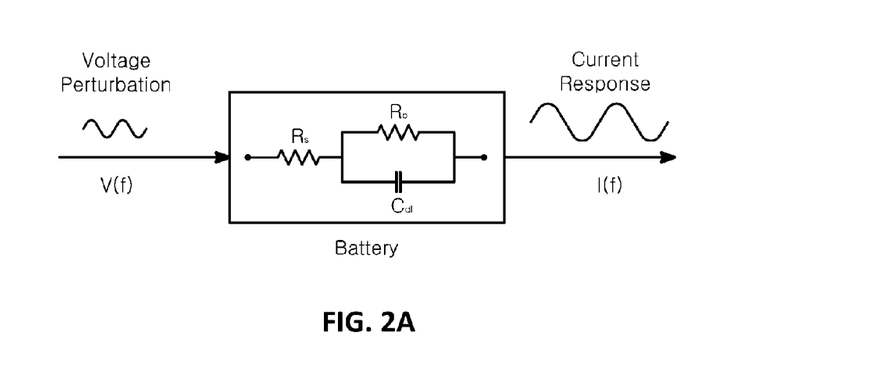
FIG. 2A is a conceptual diagram illustrating a state in which a perturbation voltage is applied to a battery to output a current response.
Figure 2B:
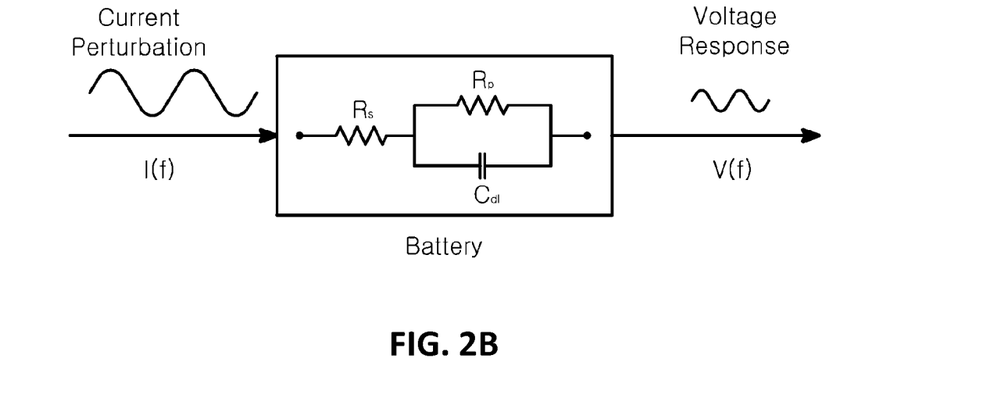
FIG. 2B is a conceptual diagram illustrating a state in which a perturbation current is applied to a battery to output a voltage response.
Figure 3:
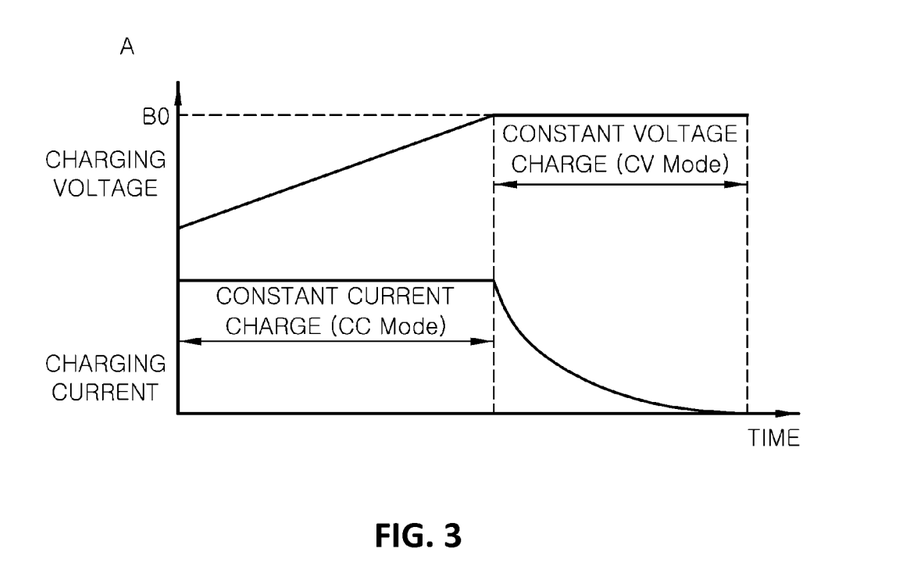
FIG. 3 is a diagram for describing a charging method of a charger according to an embodiment of the present invention.
Figure 4A:
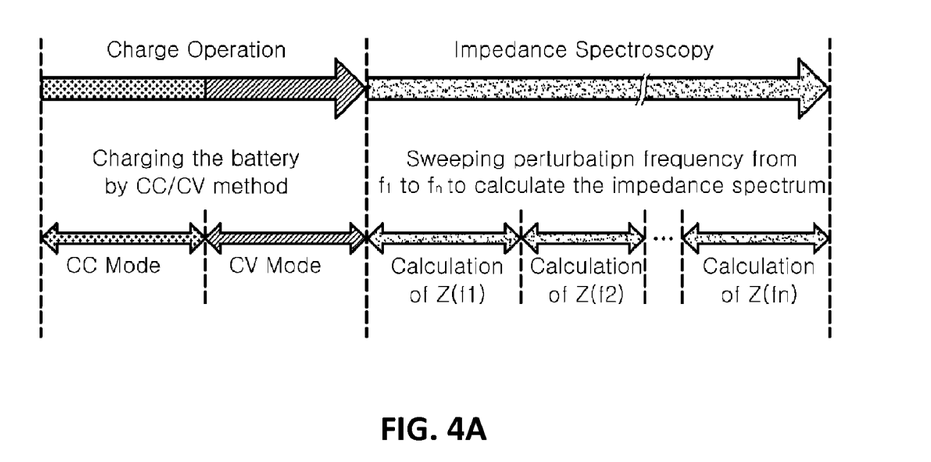
FIGS. 4A and 4B are diagrams for describing a process of estimating a lifetime of a battery using impedance spectroscopy when the charger completes charging or while the charger charges the battery.
Figure 4B:
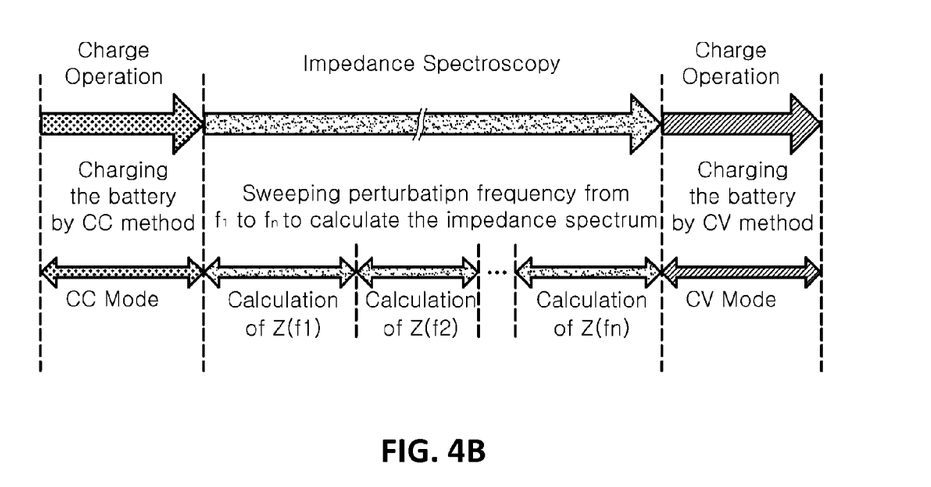
Figure 5:
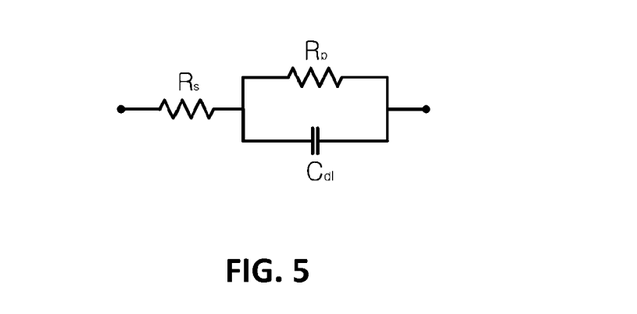
FIG. 5 is a diagram illustrating an equivalent circuit of a battery mounted on a charger according to an embodiment of the present invention.

FIG. 1A is a schematic control block diagram illustrating a charger according to an embodiment of the present invention, and FIG. 1B is a schematic control block diagram illustrating a charger according to another embodiment of the present invention. FIG. 2A is a conceptual diagram illustrating a state in which a perturbation voltage is applied to a battery 2 to output a current response, and FIG. 2B is a conceptual diagram illustrating a state in which a perturbation current is applied to a battery 2 to output a voltage response. FIG. 3 is a diagram for describing a charging method of a charger according to an embodiment of the present invention, and FIGS. 4A and 4B are diagrams for describing a process of estimating a lifetime of a battery 2 using impedance spectroscopy when the charger completes charging or while the charger performs charging. FIG. 5 is a diagram illustrating an equivalent circuit of a battery 2 mounted on a charger according to an embodiment of the present invention.

Referring to FIG. 1A, a charger 1 may include a transformer T, a rectifier RCT, a converter CNV, and a digital signal processor 100, and a battery 2 may be coupled thereto and charged.

A first coil of the transformer T may be connected between a first terminal N1 and a second terminal N2, and a wall outlet voltage Grid of 230V, for example, may be connected between the first terminal N1 and the second terminal N2. A second coil of the transformer T may supply a relatively low alternating current (AC) voltage to the rectifier RCT.

The rectifier RCT may supply an input voltage to both ends of an input terminal 10 and a reference terminal GND of the converter CNV. A smoothing capacitor smoothing the input voltage may be connected between the input terminal 10 and the reference terminal GND.

The converter CNV may include at least one switching tool operated by control of the digital signal processor 100. The converter CNV may apply a charging voltage or charging current, or a perturbation voltage or perturbation current to the battery 2 according to a control signal of the digital signal processor 100, which will be described below, and induce an output response of the battery.

The battery 2 may include an internal resistance $R_b$ and an internal capacitor $C_b$, and may be disposed between an output terminal 20 and the reference terminal GND. The battery 2 may use a Pb accumulator type, a NiCd accumulator type, a $NiH_2$ accumulator type, a nickel-metal hybrid (LiMH) accumulator type, a Li-ion accumulator type, a lithium-polymer accumulator type, a lithium-metal (LiFe) accumulator type, a Li—Mn accumulator type, a LiFePO4 accumulator type, a LiTi accumulator type, a rechargeable alkaline manganese (RAM) accumulator type, Ni—Fe accumulator type, Na/NiCl high temperature battery 2, a super charge ion battery (SciB), an Ag—Zn accumulator type, a Si accumulator type, a V-redox accumulator type, and/or a Zn—Br accumulator type of a battery cell. In particular, Pb accumulator type, a NiCd accumulator type, a LiMH accumulator type, and/or Na/NiCl accumulator type of a battery cell may be used. Here, the Pb accumulator type of battery cell may be preferably used, and any one type of batteries including the above-described types of batteries may be used as the battery 2 according to the embodiment of the present invention.

The digital signal processor 100 may include a perturbation signal generator 110, a controller 120, a current/voltage detector 130, a digital lock-in amplifier 140, a memory 150, a parameter extractor 160, a parameter analyzer 170, a lifetime estimator 180, and an alarm 190.

The perturbation signal generator 110 may include a reference direct current (DC) generator 111 and an AC signal generator 113. A sinusoidal signal generated through the AC signal generator 113 is added to a DC signal output through the reference DC generator 111 to generate a perturbation signal, which is applied to the converter CNV. The converter CNV may apply the perturbation voltage to the battery 2 according to the perturbation signal. The converter CNV may apply the perturbation voltage, in which a perturbation component is superimposed on a DC component, to the battery 2 and induce the battery 2 to output a current response. Referring to FIG. 2A, an impedance Z(f) at a frequency f may be calculated by a perturbation voltage V(f) applied through the converter CNV according to a perturbation signal of the perturbation signal generator 110 and a response current I(f), as the following Equation 1.

$$Z(f) = \frac{V(f)}{I(f)} \qquad \text{Equation 1}$$

The controller 120 may include a current controller 121, a voltage controller 123, and a controller selector 125.

The current controller 121 may generate a current control signal so that an input current exceeding an allowable range is not to supplied to the battery 2. The voltage controller 123 may generate a voltage control signal so that an input voltage exceeding an allowable range is not to supplied to the battery 2 during a constant current charging operation.

The controller selector 125 may select the current controller 121 in order to input the current control signal to the converter CNV during the constant current charging operation, and select the voltage controller 123 in order to input the voltage control signal to the converter CNV during a constant voltage charging operation. Referring to FIG. 3, the charger 1 according to the embodiment of the present invention may charge the battery 2 using a constant current/constant voltage (CC/CV) charging method. The constant current/constant voltage (CC/CV) charging method is a method in which charging starts in a constant current phase, proceeds to a constant voltage phase when a voltage of the battery 2 reaches a predetermined level, and is considered as being completed when the charging current gradually decreases and reaches a trickle level. The controller selector 125 may select the current controller 121 or the voltage controller 123 to charge the battery 2, depending on a charging method.

Meanwhile, in order for the perturbation voltage not to be distorted while measuring the impedance of the battery 2, a choice of a crossover frequency may be critical. The measurement of the impedance of the battery 2 may be recorded throughout a frequency range of 100 Hz or less, 10 Hz or less, or 1 Hz or less. According to the embodiment of the present invention, the impedance of the battery 2 may be preferably measured in a range of 0.1 Hz to 1 kHz. Accordingly, a bandwidth of a closed loop system of the charger 1 may be set to be 10 times the highest measured frequency or more. A transfer function of FIG. 1 may be calculated by the following Equation 2 and Equation 3. Equation 2 is a transfer function of an output voltage of the battery 2, and Equation 3 is a transfer function of a current input to the battery 2 through an inductor.

$$G_{vd} = \frac{V_{bus} \times (R_b C_b s + 1)}{s^3 L R_b C_b C_{out} + s^2 L(C_b + C_{out}) + s R_b C_b + 1} \quad \text{Equation 2}$$

$$G_{id} = \frac{V_{bus} \times [C_{out} C_b R_b s^2 + (C_b + C_{out})s]}{s^3 L R_b C_b C_{out} + s^2 L(C_b + C_{out}) + +s C_b R_b + 1} \quad \text{Equation 3}$$

In terms of the above-described Equation 2, 10 kHz may be selected as a bandwidth of a voltage loop. In addition, in terms of the current controller 121, 3 kHz, which is one 20th of a switching frequency, may be selected as the bandwidth of the closed loop system.

The transfer function of the voltage controller 123 and the transfer function of the current controller 121 may be set as Equation 4 by the following limitations.

$V_{bus}$=30, 0 [v], D=0.48, L=160.0 [uH], $C_{out}$=10.0 [uF], $C_b$=90000.0 [F], $R_b$=30.0 [mΩ]

However, the following Equation 4 is only an example, and the embodiment of the present invention may not be limited thereto.

$$G_{pi\_c}(s) = \frac{0.129s + 650.6}{s} \text{ and} \quad \text{Equation 4}$$

$$G_{pi\_v}(s) = \frac{12.73s + 214400}{s}$$

The current/voltage detector 130 may detect a voltage and current of the battery 2. The current/voltage detector 130 may detect the voltage and current by frequency, induced from the battery 2 by the converter CNV according to a signal from the digital signal processor 100.

The digital lock-in amplifier 140 may calculate an impedance spectrum of the voltage and current by frequency, detected by the current/voltage detector 130. An AC signal received by the digital lock-in amplifier 140 may be represented by the following Equation 5.

$$X[n] = A\sin\left(2\pi \frac{f}{f_s} n + \theta\right) + \sum A_{ne}\sin\left(2\pi \frac{f_{ne}}{f_s} n + \theta_{ne}\right) \quad \text{Equation 5}$$

The digital lock-in amplifier 140 may obtain results as illustrated in the following Equation 6 and Equation 7 by multiplying the detected signal X[n] by an in-phase signal Cn and a quadrature-phase signal Sn.

$$\begin{aligned} I[n] &= [X(n) \times C_n] \\ &= \left[A\sin\left(2\pi \frac{f}{f_s} n + \theta\right) + \sum A_{ne}\sin\left(2\pi \frac{f_{ne}}{f_s} n + \theta_{ne}\right)\right] \times \\ &\quad \cos\left(2\pi \frac{f}{f_s} n\right) \\ &= \frac{A}{2}\cos(\theta) + \text{AC component} \end{aligned} \quad \text{Equation 6}$$

$$\begin{aligned} Q[n] &= [X(n) \times S_n] \\ &= \left[A\sin\left(2\pi \frac{f}{f_s} n + \theta\right) + \sum A_{ne}\sin\left(2\pi \frac{f_{ne}}{f_s} n + \theta_{ne}\right)\right] \times \\ &\quad \sin\left(2\pi \frac{f}{f_s} n\right) \\ &= \frac{A}{2}\sin(\theta) + \text{AC component} \end{aligned} \quad \text{Equation 7}$$

The digital lock-in amplifier 140 may obtain a magnitude and a phase by filtering AC components of Equation 6 and Equation 7, as illustrated in the following Equation 8 and Equation 9.

$$x = 2 \times I[n] \approx A\cos(\theta); \ y = 2 \times Q[n] \approx A\sin(\theta) \quad \text{Equation 8}$$

$$M = \sqrt{x^2 + y^2} = A; \quad Ph = \tan^{-1}\left(\frac{y}{x}\right) = \theta \quad \text{Equation 9}$$

The memory 150 may store the impedance spectrum calculated by the digital lock-in amplifier 140.

The parameter extractor 160 may select an equivalent circuit model of the battery 2 according to the impedance spectrum extracted by the digital lock-in amplifier 140. The equivalent circuit model may be modeled by a well-known Randles equivalent circuit. Referring to FIG. 3, the equivalent circuit may be configured with two resistors $R_s$ and $R_p$ and one capacitor $C_{dl}$. The parameter extractor 160 may calculate an impedance of the equivalent circuit of the battery 2 by the following Equation 10.

$$Z(\omega) = \left[\frac{R_s\{1 + (\omega C_{dl} R_p)^2\} + R_p}{1 + (\omega C_{dl} R_p)^2}\right] + j\left[\frac{-\omega C_{dl}(R_p)^2}{1 + (\omega C_{dl} R_p)^2}\right] \quad \text{Equation 10}$$

The parameter extractor 160 may calculate a parameter of the battery 2 using a complex nonlinear least-squares fitting method.

The parameter extractor 160 may convert a complex impedance Z to an angular frequency function as illustrated in Equation 11.

$$Z = f(\omega; \theta_i); \theta_i = R_s, R_p, C_{dl} \quad \text{Equation 11}$$

The parameters Rs, Rp, and Cdl may be calculated by minimizing the following function 'Φ' illustrated in Equation 12.

$$\Phi = \sum_{i=1}^{n} [\text{Re}(y_i - Z_i)^2 + \text{Im}(y_i - Z_i)^2] \quad \text{Equation 12}$$

wherein, $y_i$ represents actually measured data, $Z(w)$ represents an impedance calculated using the equivalent circuit model. The function 'Φ' may be minimized by setting as illustrated in Equation 13.

$$\partial \Phi / \partial \theta_i = 0; \theta_i = R_s, R_p, C_{dl} \qquad \text{Equation 13}$$

wherein, when a calculated function has a variation (Δθ), a new value of the impedance may be obtained by Taylor series expansion as illustrated in Equation 14.

$$Z(\omega)_{j+1} = Z(\omega)_j + \frac{\partial Z(\omega)_j}{\partial R_s} \Delta R_s + \frac{\partial Z(\omega)_j}{\partial R_p} \Delta R_p + \frac{\partial Z(\omega)_j}{\partial C_{dl}} \Delta C_{dl} \qquad \text{Equation 14}$$

wherein, $\Delta R_s$, $\Delta R_p$, and $\Delta C_{dl}$ may be calculated using Equation 12 and Equation 14. As a result, $R_s$, $R_p$, and $C_{dl}$ may be updated by $\Delta R_s$, $\Delta R_p$, and $\Delta C_{dl}$. The above-described calculation may be continuously performed until a result of the calculation reaches a certain limit (e.g., $10^{-6}$) in order to obtain an optimum value of the equivalent model parameter calculated by the function 'Φ' of the battery 2.

The parameter analyzer 170 may compare the impedance parameter extracted through the above-described process with a reference parameter and analyze them. The parameter analyzer 170 may compare the extracted impedance parameter with the corresponding reference parameter and analyze them. The above-described impedance parameter may include $R_s$, $R_p$, or $C_{dl}$.

The lifetime estimator 180 may estimate the lifetime of the battery 2 according to the result of comparison analysis of the impedance parameter and the reference parameter by the parameter analyzer 170. The lifetime estimator 180 may estimate the lifetime of the battery 2 by comparing the impedance parameter of the battery 2 with the corresponding reference parameter (an impedance parameter of a reference battery). When the impedance parameter of the battery 2 has a deviation from the corresponding reference parameter or does not have a deviation, one lifetime status may be assigned to the battery 2. For example, when the impedance parameter of the battery 2 is higher than the reference parameter in a low frequency range, an aging status of the battery 2 may be worse than an aging status of the battery 2 having an impedance value which does not exceed a reference value. The aging status of the battery 2 may have a relationship with the amount of deviation between the calculated impedance parameter and the reference value. When the amount of deviation between the calculated impedance parameter and the reference value increases, the lifetime of the battery 2 may be determined as being in a reducing state, and when the amount of deviation between the calculated impedance parameter and the reference value is small, the lifetime of the battery 2 may be determined in a good condition.

The alarm 190 may output a warning signal when the lifetime of the battery 2 estimated by the lifetime estimator 180 is a predetermined reference value or less. The warning signal may be output in such a manner that a voice signal is output or a state of the battery 2 is displayed on an external display.

Referring to FIG. 1B, the charger 1 may include a transformer T, a rectifier RCT, a converter CNV, and a digital signal processor 100, and a battery 2 may be combined thereto and charged. Compared to the charger 1 illustrated in FIG. 1A, a perturbation signal generator 110 included in the digital signal processor 100 may be different.

In the perturbation signal generator 110 illustrated in FIG. 1A, a perturbation signal is output as a voltage signal since the reference DC generator 111 is configured with a reference DC voltage source. On the contrary, in the perturbation signal generator 110a illustrated in FIG. 1B, a perturbation signal is output as a current signal since the reference DC generator 111 is configured with a reference DC current source.

In addition, a time at which a perturbation current is applied to the battery 2 through the converter CNV illustrated in FIG. 1B may be a boundary time at which a CC mode finishes and a CV mode starts. Referring to FIG. 4B, the perturbation current may be applied to the battery 2 at the boundary time between the CC mode and the CV mode to induce an output response from the battery. That is, in a state in which charging of the battery 2 is not completed, the perturbation current may be applied to the battery 2, and the impedance of the battery 2 may be calculated by outputting a response voltage from the battery 2. Referring to FIG. 2B, an impedance at a frequency f may be calculated by a perturbation voltage V(f) applied through the converter CNV according to the perturbation signal of the perturbation signal generator 110a and a response current I(f) thereof as the following Equation 15.

$$Z(f) = \frac{V(f)}{I(f)} \qquad \text{Equation 15}$$

Meanwhile, since other configurations in FIG. 1B are operated in the same manner as the configurations described in FIG. 1A, duplicated descriptions thereof will be omitted.

In addition, although the embodiments described above with reference to FIGS. 1A and 1B include a charger using a low-frequency transformer, it is obvious that a charger using a high-frequency transformer may be used according to an embodiment of the present invention.

Figure 6:
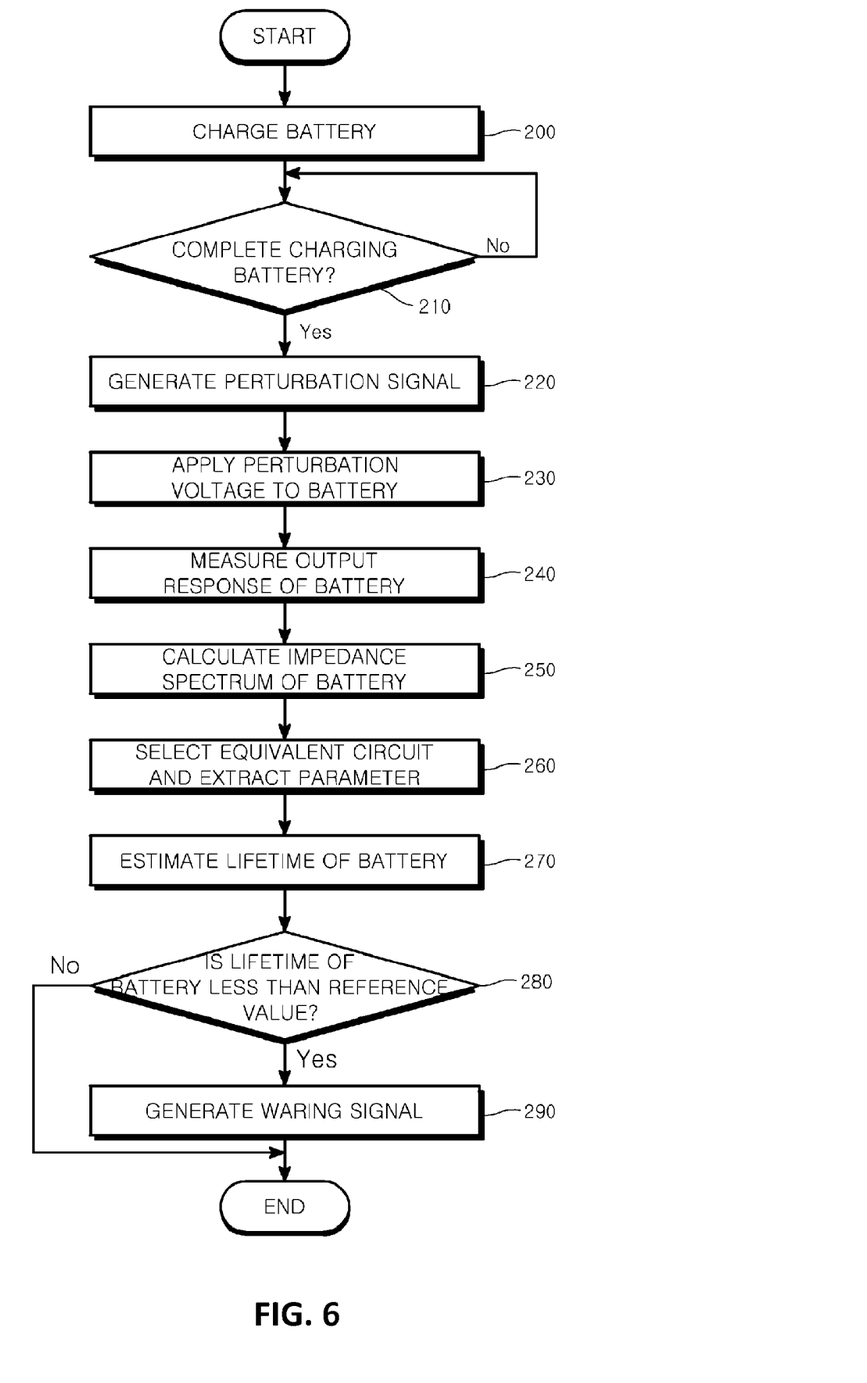
FIG. 6 is a control flowchart of a charger according to an embodiment of the present invention.

FIG. 6 is a control flowchart of a charger according to an embodiment of the present invention.

The charger 1 starts a charging operation of battery 2 according to a predetermined manipulation when the battery 2 is mounted. The digital signal processor 100 may generate a perturbation signal and transmit it to the converter CNV when charging of the battery 2 is completed (S200, S210, and S220).

When the perturbation signal is applied, the converter CNV may apply a perturbation voltage corresponding to the perturbation signal to the battery 2. The battery 2 may output a current response according to the perturbation voltage (S230 and S240).

The digital lock-in amplifier 140 may calculate an impedance spectrum according to the output response of the battery 2 (S250).

The parameter extractor 160 may calculate an equivalent circuit according to the calculated impedance spectrum and extract an impedance parameter through the equivalent circuit (S260).

The parameter analyzer 170 may compare the extracted impedance parameter with a pre-stored impedance parameter of a robust battery and analyze them. The lifetime estimator 180 may estimate a lifetime of the battery 2 according to the result of analysis through the parameter analyzer 170 (S270).

The alarm 190 may generate a warning signal when the lifetime of the battery 2 is a pre-stored reference value or less, and terminate the operation when the lifetime of the battery 2 is greater than the pre-stored reference value. In addition, the alarm 190 may specifically illustrate the estimated lifetime of the battery 2 through a display not shown in the drawings (S280).

Figure 7:
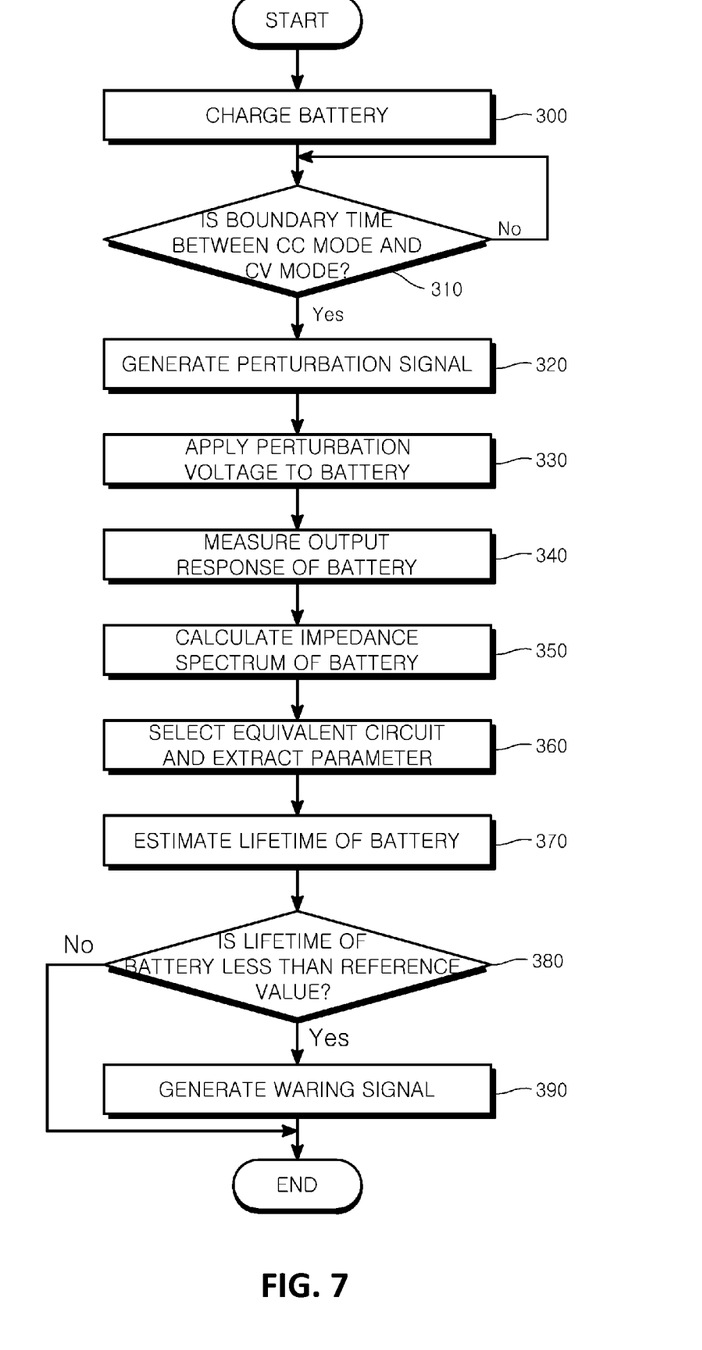
FIG. 7 is a control flowchart of a charger according to another embodiment of the present invention.

FIG. 7 is a control flowchart of a charger according to another embodiment of the present invention.

The charger 1 starts a charging operation of battery 2 according to a predetermined manipulation when the battery 2 is mounted. The digital signal processor 100 may check a time at which a CC mode is switched into a CV mode during the charging operation for the battery 2, generate a perturbation signal at the time, and transfer it to the converter CNV (S300, S310, and S320).

When the perturbation signal is applied, the converter CNV may apply a perturbation current corresponding to the perturbation signal to the battery 2. The battery 2 may output a voltage response corresponding to the perturbation current (S330 and S340).

The digital lock-in amplifier 140 may calculate an impedance spectrum according to the output response from the battery 2 (S350).

The parameter extractor 160 may select an equivalent circuit according to the calculated impedance spectrum and extract an impedance parameter through the equivalent circuit (S360).

The parameter analyzer 170 may compare the extracted impedance parameter with a pre-stored impedance parameter of a robust battery and analyze them. The lifetime estimator 180 may estimate a lifetime of the battery 2 according to the result of analysis through the parameter analyzer 170 (S370).

The alarm 190 may generate a warning signal when the lifetime of the battery 2 is a pre-stored reference value or less, and terminate the operation when the lifetime of the battery 2 is greater than the pre-stored reference value. In addition, the alarm 190 may specifically illustrate the estimated lifetime of the battery 2 through a display not shown in the drawings (S380 and S390).

Although a few embodiments have been described, it will be apparent to those skilled in the art that various modifications can be made to the above-described exemplary embodiments of the present invention without departing from the spirit or scope of the invention.

The invention claimed is:

1. A charger comprising:
a converter applying one of a perturbation voltage and a perturbation current to a battery; and
a digital signal processor:
transmitting a perturbation signal in which an alternating current (AC) signal is added to a direct current (DC) signal via the converter,
measuring an output response of the battery,
calculating an impedance spectrum according to the output response of the battery,
calculating an impedance parameter by selecting an equivalent circuit according to the impedance spectrum, and
estimating a lifespan of the battery by comparing the calculated impedance parameter of the battery with a predetermined impedance parameter of a reference battery,
the converter charging the battery in either one of a constant current mode and a constant voltage mode, and
the converter applying the perturbation current to the battery when the constant voltage mode is switched to the constant current mode.

2. The charger of claim 1, wherein
the digital signal processor includes a reference DC generator outputting the DC signal, and an AC signal generator outputting the AC signal, and
the reference DC generator is one of a reference voltage generator or a reference current generator.

3. The charger of claim 1, wherein when charging of the battery is completed, the converter applies the perturbation voltage to the battery so that the digital signal processor measures the output response.

4. The charger of claim 1, wherein the digital signal processor further includes a digital lock-in amplifier calculating the impedance spectrum according to the output response of the battery.

5. A charger comprising:
a converter applying one of a perturbation voltage and a perturbation current to a battery; and
a digital signal processor:
transmitting a perturbation signal in which an alternating current (AC) signal is added to a direct current (DC) signal via the converter,
measuring an output response of the battery,
calculating an impedance spectrum according to the output response of the battery,
calculating an impedance parameter by selecting an equivalent circuit according to the impedance spectrum, and
estimating a lifespan of the battery by comparing the calculated impedance parameter of the battery with a predetermined impedance parameter of a reference battery,
wherein the digital signal processor further includes a digital lock-in amplifier which calculates the impedance spectrum according to the output response of the battery, and
wherein the digital signal processor further includes a parameter extractor selecting an equivalent circuit model of the battery according to the impedance spectrum, and extracting the impedance parameter according to a method of extracting a parameter of the equivalent circuit model.

6. The charger of claim 1, wherein the digital signal processor further includes a parameter analyzer, which compares the impedance parameter extracted from the battery with the predetermined impedance parameter and analyze thereof.

7. The charger of claim 6, wherein the digital signal processor further includes a lifespan estimator, which calculates a reduced lifespan of the battery as being in proportion to a difference between the impedance parameter and the predetermined impedance parameter.

8. The charger of claim 1,
wherein the charger further comprises an alarm unit outputting a warning signal according to the lifespan of the battery, and
wherein the alarm unit outputs the warning signal when the lifespan of the battery is equal or less than a predetermined value.

9. A method of controlling a charger, the method comprising:
applying one of a perturbation voltage and a perturbation current to a battery;
measuring a response output from the battery and calculating an impedance spectrum thereof;
selecting an equivalent circuit according to the impedance spectrum and extracting an impedance parameter; and comparing the impedance parameter with a pre-stored impedance parameter of a reference battery and estimating a lifespan of the battery, and wherein the applying one of the perturbation voltage and the perturbation current to the battery includes applying the perturbation voltage after charging of the battery is completed, or applying the perturbation current when a charging mode of the battery is switched from a constant current mode to a constant voltage mode.

10. A method of controlling a charger, the method comprising:

applying, by a converter, one of a perturbation voltage and a perturbation current to a battery; and transmitting, by a digital signal processor, a perturbation signal in which an alternating current (AC) signal is added to a direct current (DC) signal via the converter, measuring, by the digital signal processor, an output response of the battery, calculating, by a digital lock-in amplifier of the digital signal processor, an impedance spectrum according to the output response of the battery, calculating, by the digital signal processor, an impedance parameter by selecting an equivalent circuit according to the impedance spectrum, and estimating, by the digital signal processor, a lifespan of the battery by comparing the calculated impedance parameter of the battery with a predetermined impedance parameter of a reference battery, selecting, by a parameter extractor of the digital signal processor, an equivalent circuit model of the battery according to the impedance spectrum, and extracting, by the parameter extractor of the digital signal processor, the impedance parameter according to a method of extracting a parameter of the equivalent circuit model.

11. The method of claim 9, wherein a reduced lifespan of the battery is estimated in proportion to a difference between the impedance parameter of the battery and the pre-stored impedance parameter of the reference battery.

12. The method of claim 9, wherein the method further comprises outputting a warning signal when the lifespan of the battery is equal or less than a predetermined reference lifespan.

* * * * *